US008340204B2

(12) United States Patent
Fatemi-Ghomi et al.

(10) Patent No.: US 8,340,204 B2
(45) Date of Patent: Dec. 25, 2012

(54) SOFT DECISION ENHANCEMENT

(75) Inventors: Navid Fatemi-Ghomi, Surrey (GB); Cyril Valadon, Hertfordshire (GB)

(73) Assignees: MStar Semiconductor, Inc. (KY); MStar Software R&D (Shenzhen) Ltd., Shenzhen (CN); MStar France SAS, Issy les Moulineaux (FR); MStar Semiconductor, Inc. (TW)

( * ) Notice: Subject to any disclaimer, the term of this patent is extended or adjusted under 35 U.S.C. 154(b) by 777 days.

(21) Appl. No.: 11/660,219

(22) PCT Filed: Aug. 5, 2005

(86) PCT No.: PCT/GB2005/003114
§ 371 (c)(1),
(2), (4) Date: Sep. 16, 2008

(87) PCT Pub. No.: WO2006/018605
PCT Pub. Date: Feb. 23, 2006

(65) Prior Publication Data
US 2009/0110124 A1    Apr. 30, 2009

(30) Foreign Application Priority Data
Aug. 16, 2004  (GB) .................................. 0418263.0

(51) Int. Cl.
*H04L 5/12*     (2006.01)
*H04L 23/02*    (2006.01)

(52) U.S. Cl. ......... 375/262; 714/795; 704/242; 375/341

(58) Field of Classification Search .................. 375/262, 375/341; 714/795; 704/242
See application file for complete search history.

(56) References Cited

U.S. PATENT DOCUMENTS

| | | | | |
|---|---|---|---|---|
| 5,539,757 A | * | 7/1996 | Cox et al. ...................... | 714/795 |
| 6,581,182 B1 | | 6/2003 | Lee | |
| 6,597,743 B1 | * | 7/2003 | Khayrallah et al. .......... | 375/265 |
| 7,137,060 B2 | * | 11/2006 | Yu et al. ........................ | 714/794 |
| 7,178,081 B2 | * | 2/2007 | Lee et al. ...................... | 714/752 |

FOREIGN PATENT DOCUMENTS

| | | |
|---|---|---|
| EP | 0 671 817 A1 | 9/1995 |
| GB | 2395404 A * | 5/2004 |

OTHER PUBLICATIONS

Berrou, C. et al., "A Low Complexity Soft-Output Viterbi Decoder Architecture," Proceeding of the International Conference on Communications (ICC), vol. 3, pp. 737-740, (May 23, 1993).

(Continued)

*Primary Examiner* — Shuwang Liu
*Assistant Examiner* — Nader Bolourchi
(74) *Attorney, Agent, or Firm* — Edell, Shapiro & Finnan, LLC (57) ABSTRACT

A Viterbi trellis processing technique in which soft decisions and hard decisions are derived from a received signal and the soft decisions are enhanced by being modified using the hard decisions. A log likelihood ratio for a bit of the received signal can be derived by grouping candidate metrics associated with the decision that the bit has a first state, grouping candidate metrics associated with the decision that the bit has a second state, applying respective functions to the groups and calculating the difference of the function values.

12 Claims, 4 Drawing Sheets

OTHER PUBLICATIONS

Hoeher, P., "TCM on Frequency-Selective Fading Channels: a Comparison of Soft-Output Probabilistic Equalizers," Proceedings of the Global Telecommunications Conference and Exhibition (GLOBECOM), vol. 1, pp. 376-381, (Dec. 2, 1990).

Hagenauer, J. et al., "A Viterbi Algorithm With Soft-Decision Outputs and Its Applications," IEEE, pp. 1680-1686, (Nov. 27, 1989).

Joeressen, O. J. et al., "A New Postprocessing Architecture for Soft Output Viterbi Decoding," IEEE, pp. 336-345, (Oct. 26, 1994).

* cited by examiner

SOFT DECISION ENHANCEMENT

CROSS REFERENCE TO RELATED APPLICATIONS

This application is a national phase application based on International Application No. PCT/GB2005/003114, filed Aug. 5, 2005, which claims the priority of Great Britain Patent Application No. 0418263.0, filed Aug. 16, 2004, the content of both of which is incorporated herein by reference.

In mobile communication systems, a transmission link between a transmitter and a receiver will suffer from a number of impairments. Two such effects are thermal noise and multipath fading.

Multipath fading can result in Intersymbol Interference (ISI) at the receiver if the delay spread of the channel is larger than the modulation period ('Digital Communications', Proakis, $2^{nd}$ Edition, McGraw-Hill). Hence, in a given propagation environment, ISI will become more of a problem as the transmission rate increases. For communication systems aimed at providing medium to high data rate services, the presence of ISI can severely limit the throughput of a transmission link and degrade the quality of service experienced by a user.

Some digital communication systems also introduce ISI by design. This is the case in the E-GPRS system, where the modulation pulse shape used to improve the spectral efficiency of the transmitted signal generates ISI. For more information, see 3GPP TS 05.04 V8.4.0 (2001-11), Technical Specification 3rd Generation Partnership Project; Technical Specification Group GSM/EDGE Radio Access Network; Digital cellular telecommunications system (Phase 2+); Modulation.

Another source of performance degradation experienced by a user of a Time-Division Multiple Access (TDMA) cellular communication system is interference generated by other users in the system using the same carrier or adjacent carriers. These interference effects, referred to as co-channel interference and adjacent channel interference respectively, can greatly reduce the capacity of a cellular system.

All of the impairments described above make it difficult for a receiver to reliably recover information that a transmitted signal intended to convey, leading to the use in receivers of complex algorithms for demodulating received signals. The implementation complexity of such algorithms will have a significant impact on a digital receiver in terms of overall silicon die size, processor speed, power consumption and memory requirements. Hence, the use of an efficient receiver architecture offering good transmission link performance is of considerable importance.

In order to improve the reliability of a communication link, Forward Error Correction (FEC) coding can be embedded in a transmitted signal. An FEC coding operation introduces redundancy to a transmitted signal and this redundancy can then be used at a receiver to improve the accuracy of estimates of the transmitted data that are generated by the receiver. However, for FEC coding in a transmitted signal to be most beneficial, it is important that such a signal is demodulated by a receiver in a format which can be best interpreted by an FEC decoding process within the receiver. A number of such receivers have been proposed in the past. See, for example, 'Optimal decoding of linear codes for minimizing symbol error rate', L. Bahl, J. Cocke, F. Jelinek, J. Raviv, IEEE Trans. on Information Theory, Volume: 20, March 1974; 'A Viterbi algorithm with soft-decision outputs and its applications', J. Hagenauer, P. Hoeher, GLOBECOM'89, Dallas, November 1989; 'On the equivalence between SOVA and Max-Log MAP decodings', M. P. C. Fossorier, F. Burkert, S. Lin and J. Hagenauer, IEEE Communications Letters, vol. 2, no. 5, May 1998; 'Soft information in concatenated codes', B. Rislow, T. Maseng, O. Trandem, IEEE Trans. on Communications, Vol. 44, Issue 3, March 1996; and 'TCM on frequency-selective fading channels: a comparison of soft-output probabilistic equalizers', P. Hoeher, GLOBECOM '90., December 1990. However, the implementation complexity of such prior receiver architectures is usually high.

In order to describe the computations performed by a receiver, it is first necessary to present a model of the transmission link in which the receiver participates. A suitable model is presented in FIG. 1 and will now be described in some detail. This model assumes that the information is transmitted in blocks of bits rather than as a continuous stream. However, it should be noted that the invention described later in this document is applicable to both types of transmission.

Figure 1:
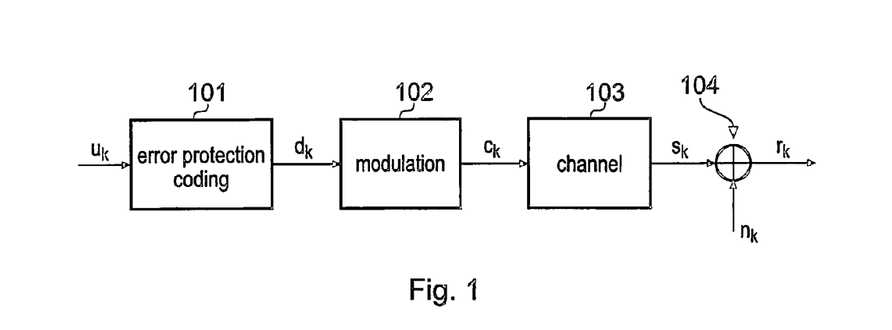
FIG. 1 illustrates a model of a communications link.

According to the model, a transmission block $\{u_k\}_{k\in(1,\ldots,K)}$ is made of K information bits, $u_k \in \{0,1\}$. Error protection is added to these bits in order to improve the reliability of the transmission. The error protection coding unit 101 generates from the block $\{u_k\}_{k\in(1,\ldots,K)}$ a transmission block $\{d_k\}_{k\in(1,\ldots,D)}$ made of D (where D>K) information bits, $d_k \in \{0,1\}$. The information bits $d_k$ are grouped into C sets of M bits (it can be assumed, without loss of generality, that D=M×C). Each of these sets can be denoted $\Delta_k$, where $\Delta_k = \{d_{M\times k}, \ldots, d_{(M\times k)+(M-1)}\}$.

Each set of M information bits $\Delta_k$ is modulated onto the complex plane using a modulation scheme M that maps sets of M bits onto the complex plane. This mapping is performed by a modulation unit 102. For example, in the case of an 8PSK modulation, the modulation M can be expressed as:

$$M(\Delta_k) = M(\{d_{3\times k}, d_{3\times k+1}, d_{3\times k+2}\}) = \exp\left(2 \cdot j \cdot \pi \times \left(\frac{(4 \cdot d_{3\times k}) + (2 \cdot d_{3\times k+1}) + (1 \cdot d_{3\times k+2})}{8}\right)\right)$$

A slightly modified version of the 8PSK modulation described by the above equation is used in the E-GPRS system.

A set of M information bits $\{d_{M\times k}, \ldots, d_{(M\times k)+(M-1)}\}$ can be uniquely identified with a single decimal number i $\{0 \leq i \leq 2^{M-1}\}$ calculated using the one-to-one function D described in the following equation:

$$D(\{d_0, \ldots, d_{M-1}\}) = \sum_{i=0}^{M-1} d_i \times 2^i$$

This equation maps the M binary values in a set $\Delta_k$ to a unique value in the set $\{0, \ldots, 2^{M-1}\}$. The set of information bits $d_b$ ($b\in\{0, \ldots, M\}$) that verify the above equation for a given value of i can be denoted $D_b^{-1}(i)$ ($b\in\{0, \ldots, M\}$).

The C modulated symbols representing a transmission block are transmitted over the air and in the process are distorted by the propagation channel 103. Assuming a general model with memory for the propagation channel, the samples $\{s_k\}_{k\in(1,\ldots,C)}$ at the input of a receiver can be expressed as:

$$\begin{cases} s_k = F(c_k, \xi_{k-1}) \\ \xi_k = S(c_k, \xi_{k-1}) \end{cases}$$

Here, $c_k = M(\Delta_k)$ and $\xi_k$ represents the state (memory) of the propagation channel when the $k^{th}$ modulated symbol is transmitted. Note that any filtering performed by either the transmitter and/or the receiver can be incorporated in the propagation channel model. The mappings F and S used to model the propagation channel can be time varying. However, to simplify the notations, it is assumed in this document that these mappings do not depend on time. Note, however, that the approach described here is also applicable to time-varying channels.

In most cases, the propagation channel mappings F and S can be modelled as linear filtering operations:

$$\begin{cases} s_k = \sum_{i=0}^{L-1} h_i \times c_{k-i} \\ \xi_k = \{c_k, \ldots, c_{k-L+1}\} \end{cases}$$

In the above example, it is assumed that the memory of the channel is limited to L modulated symbols. In reality, the memory of the channel may be infinite. However, for any desired power threshold T, it is usually possible to find a value L such that:

$$\left(\sum_{k \geq i} |h_k|^2\right) \leq T \text{ for } i \geq L-1$$

Hence, by selecting the threshold T such that the residual power is low enough, it is possible to assume that the channel memory is limited. When this is done, the channel mapping can be described with just a set of filter coefficients $\{h_i\}_{i \in \{0, \ldots, L-1\}}$.

In the model described here, it has been assumed, without loss of generality, that the filter representing the channel propagation is causal.

In order to recover the transmitted symbols $c_k$, the receiver will need to know the propagation channel mapping. However, the receiver will usually not have prior knowledge of the propagation channel conditions. It may nevertheless be possible for the receiver to generate estimates of the channel coefficients $\{h_i\}_{i \in \{0, \ldots, L-1\}}$ which can be used in place of the true values. For example, in the EGPRS system, a transmitted signal will incorporate a pattern, referred to as training sequence, which is known to the receiver and the receiver can use this training sequence to generate an estimate of the propagation channel conditions.

The signal $\{s_k\}_{k \in \{1, \ldots, C\}}$ is corrupted by additive $\{n_k\}_{k \in \{1, \ldots, C\}}$ noise, introduced at process 104, such that a block of symbols from which the receiver tries to recover transmitted information can be expressed as:

$$r_k = s_k + n_k \; (k \in \{1, \ldots, C\})$$

The aim of a receiver is to generate the sequence $\{\hat{u}_k\}_{k \in \{1, \ldots, C\}}$ which maximises the set of A-Posteriori probabilities $P(\hat{u}_k|R)$, where k belongs to the set $\{1, \ldots, C\}$ and R denotes the set $\{r_k\}_{k \in \{1, \ldots, C\}}$.

Note that if one assumes that the information bits take the values 0 and 1 with equal probability, then the maximum A-Posteriori solution is also the solution which achieves the maximum likelihood criterion:

$$\max_k P(R|\hat{u}_k)$$

Hence, a full maximum A-Posteriori receiver will estimate a sequence of transmitted bits $\{u_k\}_{k \in \{1, \ldots, K\}}$ by taking into account the error correction coding and the modulation scheme at the same time. Such a receiver will perform well and allow a good throughput for a transmission link. However, because error correction decoding and demodulation are performed simultaneously, the implementation complexity of such a receiver is almost always prohibitive. Hence suboptimum solutions are usually preferred. Practical solutions usually separate the demodulation from the error correction decoding, as in FIG. 2. The sequence of received symbols $\{r_k\}_{k \in \{1, \ldots, C\}}$ is used by unit 201 to calculate estimates $\{\hat{d}_k\}_{k \in \{1, \ldots, D\}}$ of the transmitted coded bits $\{d_k\}_{k \in \{1, \ldots, D\}}$. The error correction decoding unit 202 uses the symbols $\{\hat{d}_k\}_{k \in \{1, \ldots, D\}}$ in order to derive estimates $\{\hat{u}_k\}_{k \in \{1, \ldots, K\}}$ of the transmitted uncoded bits $\{u_k\}_{k \in \{1, \ldots, K\}}$. The algorithms used for the error correction decoding 202 can be divided into two broad classes depending on the type of inputs being used. The first class corresponds to receivers which use hard decision decoding. These decoding techniques use only the estimates of the coded bits $\{\hat{d}_k\}_{k \in \{1, \ldots, D\}}$ in order to produce estimates $\{\hat{u}_k\}_{k \in \{1, \ldots, K\}}$ of the uncoded bits. The second class corresponds to receivers which use soft decision decoding. These decoding technique rely not only on the sequence of estimated bits $\{\hat{d}_k\}_{k \in \{1, \ldots, D\}}$ but also make use of information about the reliability of this bit sequence. Because the soft decision decoding approach uses information about the reliability of the estimated bits $\{\hat{d}_k\}_{k \in \{1, \ldots, D\}}$, soft decision decoding receivers usually perform better than hard decision decoding receivers.

Figure 2:
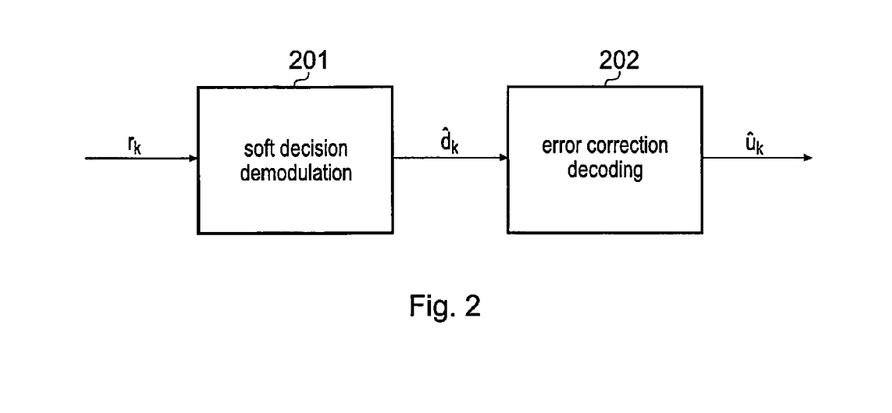
FIG. 2 illustrates a genre of receiver architectures.

When the soft decision decoding approach is used, the information input to the error correction decoding unit 202 is the Log-Likelihood Ratio (LLR), which for the coded bit $d_k$ is expressed as:

$$\lambda_k = \log\left(\frac{P(d_k = 1 | R)}{P(d_k = 0 | R)}\right)$$

As a side-note, it can be seen that estimates of the coded bits can be generated from these LLR using the following rule:

$$\hat{d}_k = \begin{cases} 0 \text{ if } \lambda_k < 0 \\ 1 \text{ if } \lambda_k \geq 0 \end{cases}$$

Note that in the case when $\lambda_k = 0$, both $d_k = 0$ and $d_k = 1$ are equally likely, hence either decision can be made.

According to one aspect, the invention provides apparatus for manipulating a received signal which corresponds to a transmitted signal comprising a series of bits, the apparatus comprising means for processing the received signal using a Viterbi algorithm to produce candidate metrics for states arranged in a trellis and to make selections from amongst the candidate metrics to provide metrics for said states, means for producing an initial soft decision for a bit of said series from said candidate metrics, means for producing a hard decision for said bit from a metric selection corresponding to reception of said bit and means for modifying the initial soft decision in a manner dependent upon the hard decision to produce an enhanced soft decision for said bit.

According to that aspect, invention also consists in a method of manipulating a received signal which corresponds to a transmitted signal comprising a series of bits, the method comprising a step of processing the received signal using a Viterbi algorithm to produce candidate metrics for states arranged in a trellis and to make selections from amongst the candidate metrics to provide metrics for said states, a step of producing an initial soft decision for a bit of said series from said candidate metrics, a step of producing a hard decision for said bit from a metric selection corresponding to reception of said bit and a step of modifying the initial soft decision in a manner dependent upon the hard decision to produce an enhanced soft decision for said bit.

In certain embodiments, the initial soft decision is produced as a log likelihood ratio from candidate metrics.

In certain embodiments, the hard decision is produced by storing a decision history of metric selections that are made in calculating metrics through the trellis and then tracing back through the decision history to produce the hard decision. The trace-back operation may be initiated after processing only a portion of the trellis.

In certain embodiments, metrics are produced for the trellis states using a reduced-state technique in which metric selections made in moving through the trellis are treated as symbol decisions for calculating metrics further along the trellis and one of the metric selections is selected to provide the hard decision. The metric selection may indicate a modulation symbol that requires translation to recover the hard decision.

In certain embodiments, the value of the enhanced soft decision is selected from a group of values conditional on the state of the hard decision.

In certain embodiments, the value of the enhanced soft decision is selected from a group of values conditional on the polarity of the initial soft decision.

According to another aspect, the invention provides apparatus for manipulating a received signal using a Viterbi algorithm to produce metrics for states in a trellis, wherein the received signal corresponds to a transmitted signal comprising a series of bits and the apparatus comprises means for performing an update of the metrics corresponding to reception of a bit by calculating candidate metrics for all the states, means for calculating a function of a plurality of the candidate metrics that correspond to a decision that the bit is a logical one, means for calculating a function of a plurality of the candidate metrics that correspond to a decision that the bit is a logical zero and means for calculating the difference of the values of the two functions.

According to that aspect, the invention also consists in a method of manipulating a received signal using a Viterbi algorithm to produce metrics for states in a trellis, wherein the received signal corresponds to a transmitted signal comprising a series of bits and the method comprises a step of performing an update of the metrics corresponding to reception of a bit by calculating candidate metrics for all the states, a step of calculating a function of a plurality of the candidate metrics that correspond to a decision that the bit is a logical one, a step of calculating a function of a plurality of the candidate metrics that correspond to a decision that the bit is a logical zero and a step of calculating the difference of the values of the two functions.

Received bits used in progressively calculating metrics through the trellis may arrive as part of a modulated symbol conveying more than one bit of the transmitted signal. It may be the case that modulated symbols rather than received bits per se are used to update trellis metrics.

The routines according to the present invention for manipulating metrics and soft decisions can be implemented in hardware or as software for execution by suitable data processing hardware. These routines can implemented within, for example, a base station of a wireless communications network or a telephone for use in such a network.

The manipulation of the received signal by the invention may be for the purpose of demodulation or decoding of the signal. In the former case, the trellis states may by defined by the possible permutations of symbols in the channel memory. In the latter case, the trellis states may be defined by the possible permutations of symbols in a memory arrangement forming part of a convolutional encoder involved in the production of the received signal.

By way of example only, certain embodiments of the invention will now be described with reference to the accompanying drawings, in which.

The proposed receiver architecture also has the general structure shown in FIG. 2. The demodulation unit 201 uses Viterbi processing to produce a stream of soft decisions, in the form of LLRs or estimates of the LLRs, for use by the error correction decoding unit 202. The different computations involved in the Viterbi processing will not be detailed and only those computations that facilitate the description of this embodiment of the invention will now be presented. For a more detailed description of the computations involved in the Viterbi processing used here, see, for example, 'TCM on frequency-selective fading channels: a comparison of soft-output probabilistic equalizers', P. Hocher, GLOBECOM '90, December 1990.

The implementation of the Viterbi processing used in the demodulation unit 201 will first be described for the case of a full trellis (i.e. all the hypotheses for the transmitted bits associated with the different channel taps are taken into account); the case of a reduced-state trellis will be described later. In the full trellis case, the number of states in the trellis used to perform the Viterbi decoding, denoted S, is equal to $2^{M \times L}$. Moreover, any given state in the trellis has $2^M$ "merging states" leading into it.

When the symbol $r_k$ is received, the metrics associated with the different states in the trellis are updated according to the equation:

$$\gamma_m(k+1) = \max_{i=0,\ldots,2^M-1} \{\chi_m^{k+1}(i)\} \ 0 \le m \le S-1$$

Note that, for a given modulation M, there is a one-to-one relationship, denoted H(m), between each state index m and the set of hypotheses $\{\tilde{c}_k, \ldots, \tilde{c}_{k-L+2}\}$ for the transmitted information symbols. H is a function that maps a value from the set $\{0, \ldots, S-1\}$ to a value in a set of L−1 complex numbers.

Also note that it is possible to add or subtract any value, constant over the different states, to this update without changing the soft decisions generated by the algorithm. Such an approach may be used when the proposed receiver architecture is implemented using fixed-point number representation in order to reduce the computational complexity.

The candidate metrics $\chi_m^{k+1}(i)$ are calculated using the state metrics from the previous iteration with the recursive equation:

$$\chi_m^{k+1}(i) = \gamma_{p(m,i)}(k) - B(r_k, p(m,i), m)$$

Here, $p(m,i)$ $\{0 \leq m \leq S-1; 0 \leq i \leq 2^{M-1}\}$ is the index of the state leading into the state with index m in the path that corresponds to a hypothesis transmitted complex symbol c equal to $M(D^{-1}(i))$.

The branch metrics are calculated using the following equation:

$$B(r_k, p(m, i), m) = \left| r_k - \sum_{u=0}^{L-1} h_u \times \tilde{c}_{k-u} \right|^2$$

As a full trellis approach is being used, the hypothesis samples $\tilde{c}_{k-u}$ used in the above branch metric calculation are taken from the states $p(m,i)$ and m that the branch metric interconnects.

Note that the branch metric described in the above equation can be calculated in other ways. It is possible to modify the computation of the branch metric, based on, for example, knowledge of, or an estimation of, the statistical distribution of noise affecting the transmitted block.

The LLR for the set of transmitted bits $\{d_{M \times (k-L+1)}, \ldots, d_{M \times (k-L+1)+M-1}\}$ are then calculated using the following equation:

$$\lambda_{M \times (k-L+1)+b} = \max_{\substack{m \in \{0, \ldots, S-1\} \\ i \in \{0, \ldots, 2^M - 1 | D_b^{-1}(i) = 1\}}} (\chi_m^{k+1}(i)) - \max_{\substack{m \in \{0, \ldots, S-1\} \\ i \in \{0, \ldots, 2^M - 1 | D_b^{-1}(i) = 0\}}} (\chi_m^{k+1}(i)) \quad b \in \{0, \ldots, M-1\}$$

The various computations presented above in relation to Viterbi processing correspond to one possible implementation of the prior-art approach presented in 'TCM on frequency-selective fading channels: a comparison of soft-output probabilistic equalizers', P. Hoeher, GLOBECOM '90, December 1990. Several modifications to the manner in which LLRs can be calculated will now be described.

The foregoing equation for calculating the LLR $\lambda_{M \times (k-L+1)+b}$ only uses the maximum candidate metrics $\chi_m^{k+1}(i)$ corresponding to the decisions $D_b^{-1}(i)=0$ and $D_b^{-1}(i)=1$ for the bit $d_b$ being decoded. The LLR can be improved by grouping first all the metrics corresponding to a decision 1, then all the metrics corresponding to a decision 0 and calculating the difference. This is shown in the following modified equation:

$$\lambda_{M \times (k-L+1)+b} = f(\chi_m^{k+1}(i))_{\substack{m \in \{0, \ldots, S-1\} \\ i \in \{0, \ldots, 2^M - 1 | D_b^{-1}(i) = 1\}}} - f(\chi_m^{k+1}(i))_{\substack{m \in \{0, \ldots, S-1\} \\ i \in \{0, \ldots, 2^M - 1 | D_b^{-1}(i) = 0\}}} \quad b \in \{0, \ldots, M-1\}$$

$f$ is a function which takes as input $S \times 2^{M-1}$ candidate metrics and returns a single value. Note that a non-linear processing step can be used for the combination, using function f, of the metrics within each group rather than a simple a summation. One possible implementation of the metrics combination function $f$ is as follows:

$$f(x_0, x_1, \ldots, x_{S \times 2^{M-1}-1}) = \log\left( \sum_{i=0}^{2^{M-1}-1} e^{\frac{x_i}{\sigma}} \right)$$

where $\sigma$ is a constant which can be derived, from example, from the estimation of the power of the noise in the received signal. Note that the computation of the above metrics combination function can be efficiently implemented by recursively using the following equation:

$$\log(e^a + e^b) = \max(a,b) + \log(1 + e^{\min(a,b) - \max(a,b)})$$

The decisions made in selecting which candidate metrics become the state metrics according to the equation $$\gamma_m(k+1) = \max_{i=0, \ldots, 2^M - 1} \{X_m^{k+1}(i)\}$$

(where $0 \leq m \leq S-1$) can be used to modify "initial" LLRs, generated using either of the two schemes described earlier, into "enhanced" LLRs.

The decisions made in the calculation of the state metrics needed to produce the initial LLRs are stored in a decision history. For a given state metric $\gamma_m(k+1)$, the information stored in the decision history is the modulated symbol i to which the decision corresponds, as given by the following equation:

$$\Gamma_m(k+1) = \operatorname*{argmax}_{i=0, \ldots, 2^M - 1} \{\chi_m^{k+1}(i)\}$$

Once a decision history has been accumulated for an entire received block $\{r_k\}_{k \in \{1, \ldots, C\}}$, it is possible to trace back through the trellis representing that block with the aid of the decision history to derive the path which corresponds to the most likely sequence of transmitted modulated symbols. Each trace-back step will generate an estimate a modulated symbol $c_k$ which, in turn, generates an estimate of the set of transmitted bits $\{\tilde{d}_{M \times (k-L+1)}, \tilde{d}_{M \times (k-L+1)+1}, \ldots, \tilde{d}_{M \times (k-L+1)+M-1}\}$. Note that the initial LLRs are generated in increasing order of k in a forward computation phase, whereas, during the trace-back processing, the estimated transmitted bits $\{\tilde{d}_{M \times (k-L+1)}, \tilde{d}_{M \times (k-L+1)+1}, \ldots, \tilde{d}_{M \times (k-L+1)+M-1}\}$ are generated in decreasing order of k.

If the trellis is terminated to a known state, the trace-back processing can be performed starting from this known state. On the other hand, if the trellis can end with equal probabilities in any of the states, then the trace-back can be performed from the state which the state metrics indicate as being the most likely.

Note as well that it is not necessary to wait for the completion of the trellis processing of an entire burst before the trace-back computations are performed. The trace-back processing can be performed at any point during the aforementioned forward computation stage. The selection of the point at which trace-back processing is performed allows memory requirements to be balanced against computational complexity.

The initial LLR $\lambda_{M \times (k-L+1)+b}$ computed during the forward phase are combined with the estimated transmitted bits $\tilde{d}_{M+(k-L+1)+b}$ derived from the trace-back processing to generate enhanced LLR which are denoted $\tilde{\lambda}_{M \times (k-L+1)+b}$.

By combining the initial LLR values with the bit decisions $\tilde{d}_{M \times (k-L+1)+b}$ generated by the trace-back operation, the enhanced LLRs have improved accuracy. Since the bit decisions $\tilde{d}_{M\times(k-L+1)+b}$ are generated from the processing of the whole burst, the enhanced LLR values make use of the redundant information embedded in the received signal that the initial LLR value do not employ. Moreover, the increase in complexity and memory requirements caused by the trace-back and LLR modification processes is very limited.

Different approaches can be selected for the combination of the initial LLRs with the transmitted bits estimated during the trace-back process. Two possible approaches will now be described.

In one approach, the enhanced LLRs are generated using the following rule:

$$\tilde{\lambda}_{M\times(k-L+1)+b} = \begin{cases} |\lambda_{M\times(k-L+1)+b}| & \text{if } \tilde{d}_{M\times(k-L+1)+b} = 0 \\ -|\lambda_{M\times(k-L+1)+b}| & \text{if } \tilde{d}_{M\times(k-L+1)+b} = 1 \end{cases}$$

When this combination method is used, the sign of the updated LLR values always corresponds to the MLSE solution. Hence, this proposed approach provides very good performance when no or little redundancy is provided by the error correction scheme. For example, in GPRS and E-GPRS systems, where the level of redundancy provided by the error correction scheme varies, this approach ensures that weak transmission modes should still have good performance.

In another approach, the enhanced LLRs are generated using the following rule:

$$\tilde{\lambda}_{M\times(k-L+1)+b} = \begin{cases} 0 & \text{if } (\lambda_{M\times(k-L+1)+b} < 0 \text{ and } \tilde{d}_{M\times(k-L+1)+b} = 0) \\ 0 & \text{if } (\lambda_{M\times(k-L+1)+b} > 0 \text{ and } \tilde{d}_{M\times(k-L+1)+b} = 1) \\ \lambda_{M\times(k-L+1)+b} & \text{otherwise} \end{cases}$$

Note that in the two methods of producing the enhanced LLRs described above, the association rule between the estimated bit $\tilde{d}_{M\times(k-L+1)+b}$ and the sign of the enhanced LLRs can be changed to match the decision convention used by the receiver.

Figure 3:
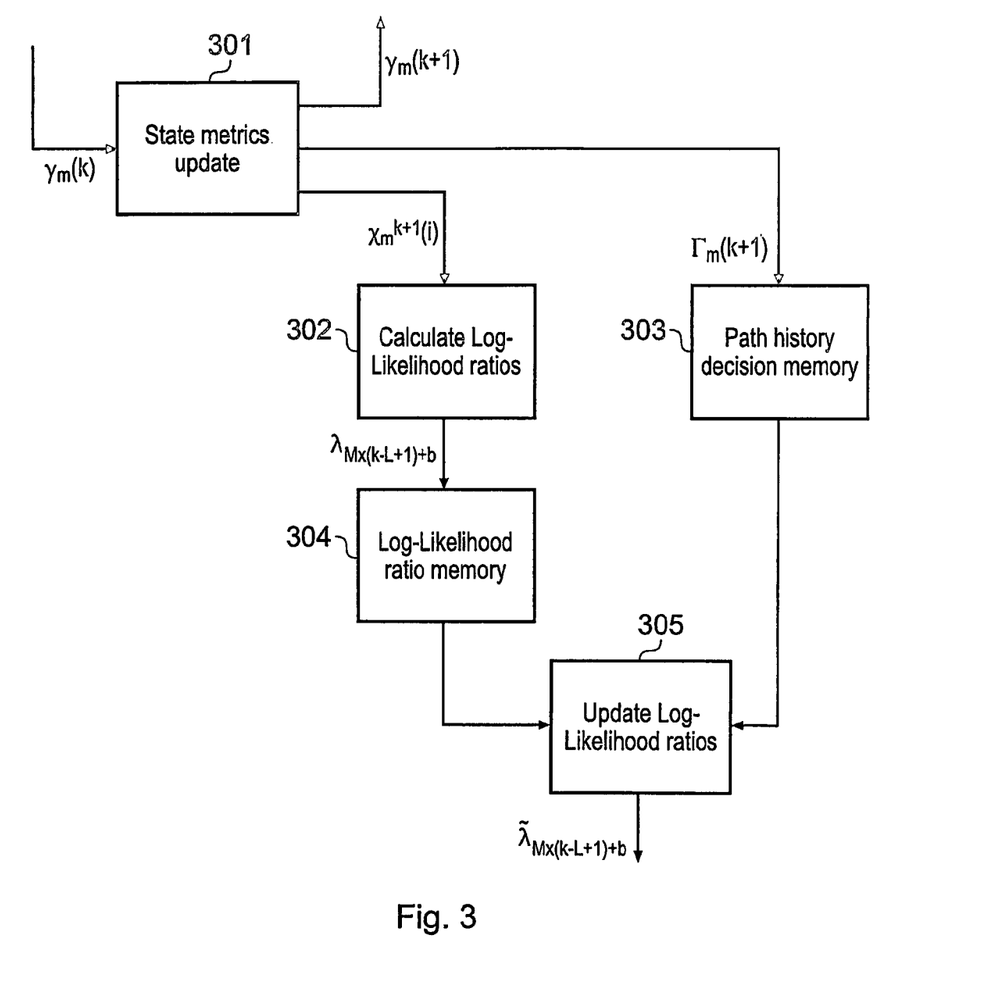
FIG. 3 illustrates a full-trellis demodulator scheme according to an embodiment of the invention.

FIG. 3 presents the different processing stages that are involved in the generation of enhanced LLRs from initial LLRs. The state metrics update unit 301 calculates the state metrics $\gamma_m(k+1)$ using the maxima of the candidate metrics of the branches that lead into the states. As part of these state metrics update computations, the various candidate metrics $\chi_m^{k+1}(i)$ and the different best candidate metric indices $\Gamma_m(k+1)$ are generated as described earlier. The candidate metrics $\chi_m^{k+1}(i)$ are used by unit 302 in order to derive the initial LLRs $\lambda_{M\times(k-L+1)+b}$. Once calculated, the initial LLRs are stored in an LLR memory 304. Similarly, the branch metric indices $\Gamma_m(k+1)$ are stored in a path history decision memory 303. Then, when the trace-back point is reached (for example at the end of the transmission block), the initial LLRs are, using one of the rules described above, combined in unit 305 with the decisions $\tilde{d}_{M\times(k-L+1)+b}$ derived from the trace-back processing in order to derive the enhanced LLRs $\tilde{\lambda}_{M\times(k-L+1)+b}$. Although it is possible to implement units 301 to 305 as separate pieces of hardware, it is more likely that unit 301, 302 and 305 will be implemented as software elements for execution by a microprocessor with the functions of memories 303 and 304 being served by a single memory associated with the microprocessor.

As mentioned earlier, the demodulation stage of the proposed receiver architecture can employ reduced-state, rather than full-trellis, Viterbi processing. For long propagation channels (i.e. where L is large) or for communications systems using high-order modulation schemes (i.e. where M is large), the implementation complexity of the full trellis approach is often prohibitive. For example, in the E-GPRS system using 8-PSK modulation, the total number of states, even for channels with relatively low delay spreads, is far too large to be efficiently implemented in a mobile receiver. Different approaches have been proposed in the past in order to reduce the number of states to be processed in the receiver. These approaches, generally referred to as reduced-state processing, include, for example, the Delayed Decision Feedback Sequence Equaliser (DDFSE; see, for example, 'Delayed decision-feedback sequence estimation', A. Duel-Hallen, C. Heegard, IEEE Trans. on Communications, Vol. 37, Issue 5, May 1989) and the Reduced State Sequence Estimator (RSSE; see, for example, 'Reduced-state sequence estimation for coded modulation of intersymbol interference channels', M. V. Eyuboglu, S. U. H. Qureshi, IEEE Journals on Selected Areas in Communications, Volume: 7, Issue: 6, August 1989).

A DDFSE architecture will now be described in which bit decisions $\tilde{d}_{M\times(k-L+1)+b}$ are used to produce enhanced LLRs. It will, however, be understood that the principles of the schemes described in this document for modifying LLRs using hard decisions about transmitted bits can also be applied to receivers using different reduced-state Viterbi processing architectures, such as the RSSE.

In a DDFSE receiver architecture, the state reduction is achieved by splitting the channel into two sections. The first section of the channel (with length $L_f$) is processed in a way similar to the full-state approach. However, for the remainder of the channel (with length $L_r$ such that $L=L_f+L_r$), the modulated symbols derived from previous decisions are used rather than testing all the possible hypotheses. Using this method, the number of states for which trellis processing is performed is reduced from $2^{M\times(L-1)}$ to $2^{M\times(L_f-1)}$. To reflect this change in the number of states, the branch metric computations need to be modified as follows:

$$B(r_k, p(m, i), m) = \left| r_k - \sum_{u=0}^{L_f-1} h_u \times \tilde{c}_{k-u} - \sum_{u=L_f}^{L_f+L_r-1} h_u \times \hat{c}_{k-u}(p(m, i)) \right|^2$$

It can be seen from the above equation that the computations involving the first $L_f$ taps are identical to those performed in the full trellis approach. However, for the last $L_r$ taps, the hypothesis symbols $\tilde{c}_{k-u}$ are replaced by hard decision symbols $\hat{c}_{k-u}(p(m,i))$. These hard decisions symbols are generated using the decisions taken during the candidate metrics' selection. The hard decision symbols are associated with each state in the trellis and are updated as the state metrics are updated such that the selection involved in determining $\gamma_m(k+1)$ determines $\hat{c}_k(m)$. Each hard decision symbol $\hat{c}_{k-u}(m)$ is uniquely associated with M bit decisions $d_{M\times(k-u+1)+b}|b\in\{0, \ldots, M-1\}$. The branch metrics are then used in one of the schemes outlined earlier in order to generate initial LLRs $\lambda_{M\times(k-L+1)+b}$.

The $\gamma_m(k+1)$ are compared for all m to deduce which state is most likely to be correct. Inherent in that state, is a set of hard decision symbols $\hat{c}_{k-u}(m)$ where $u\in\{L_f, \ldots, L_f+L_r-1\}$. The hard decision symbol $\hat{c}_{k-L_f-L_r+1}(m)$ in that set corresponds to M bit decisions $d_{M\times(k-L+1)+b}|b\in\{0, \ldots, M-1\}$. Those bit decisions can then be combined with the initial LLRs if $\lambda_{M\times(k-L+1)+b}$ that have been estimated from the candidate metrics $\chi_m^{k+1}(i)$ in order to derive the enhanced LLRs $\tilde{\lambda}_{M\times(k-L+1)+b}$ using, for example, either of the two rules described above since the methods used in the full-trellis approach for the combination of the bit decisions with the initial LLR values can be used just the same in the DDFSE architecture.

Note that, in the preceding paragraph, the earliest member $\hat{c}_{k-L_f-L_r+1}(m)$ of the set $\hat{c}_{k-u}(m)$ where $u\in\{L_f\ldots,L_f+L_r-1\}$ is used to create the enhanced LLRs $\tilde{\lambda}_{M\times(k-L+1)+b}$. The set of hard decisions $\hat{c}_{k-u}(m)$ where $u\in\{L_f\ldots,L_f+L_r-1\}$ is the smallest set of hard decisions that need to be stored in order to perform the branch metric computations. Hence, by using hard decisions from this set in order to generate the enhanced LLRs, the memory requirements for the receiver are kept to a minimum. However, by increasing the amount of information stored in the receiver, it is possible to combine the initial LLR estimates with older hard decision symbols. By so doing, the accuracy of the enhanced LLR values can be improved. However, this introduces a larger processing delay in the generation of the enhanced LLRs.

The main difference between the processing performed for full-state and reduced-state receiver architectures lies in the way the hard decisions are generated. In a full-trellis receiver architecture, all the branch metric decisions are stored such that a trace-back operation can be performed once the complete transmission block has been processed in order to derive the hard decisions. In a reduced-state receiver architecture, the hard decisions become available as the initial LLRs are generated and therefore the enhanced LLRs can be produced whilst initial LLR generation is on-going. This means that no explicit trace-back operation is required for a reduced-state receiver architecture. Note, however, that the set of hard symbol decisions $\hat{c}_{k-u}(m)$ associated with the most probable $\gamma_m(k+1)$ is analogous to a partial trace-back. Moreover, there is no need for a large path history decision memory. Only the last $L_r$ hard decision symbols $\hat{c}_{k-u}(m)$ need to be stored for each state.

It is, however, possible to use a receiver architecture where a sequence of decision symbols extending back beyond the last $L_r$ decision symbols are stored for each state. This means that the partial trace-back represented by such a sequence will extend back earlier in time. As is well known, the further back a trace-back operation runs, the more reliable its results will be. Therefore, the hard decision symbols towards the "early" end of such a sequence will be more reliable the further back in time the sequence extends. Hence, by extending the length of the sequences of hard symbol decisions, an opportunity is created for using more reliable symbol decisions in the creation of the enhanced LLRs. However, lengthening the sequences of symbol decisions attached to the states leads to increases in the amount of memory required and the delay that elapses before the trellis processing produces the hard bit decision required for adapting a given initial LLR into an enhanced LLR.

Figure 4:
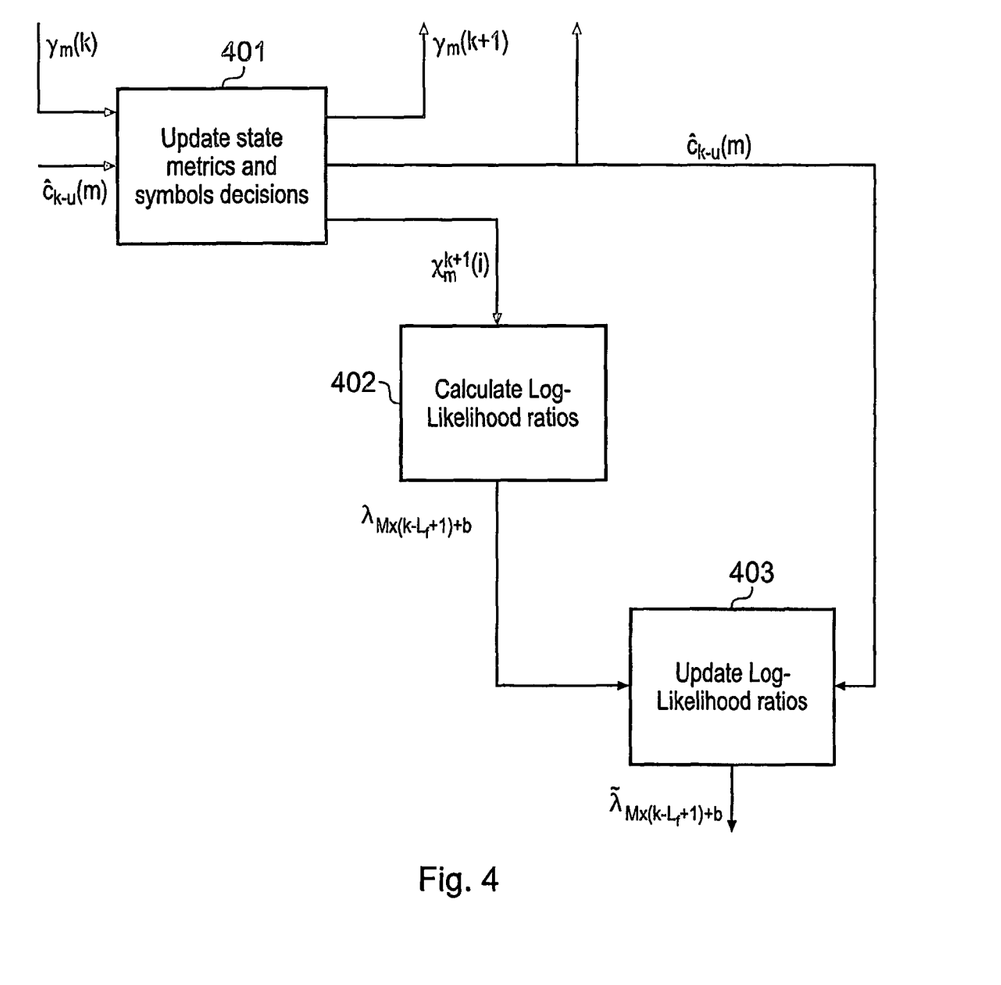
FIG. 4 illustrates a reduced-state trellis demodulator scheme according to an embodiment of the invention.

FIG. 4 presents a receiver architecture for reduced-state processing that can be used to implement the DDFSE architecture described above. The state metrics $\gamma_m(k+1)$ and the sets of past decision symbols $\hat{c}_{k-u}(m)$ that are attached to the states are updated by unit 401. As part of the state metrics update computations, the different candidate metrics $\chi_m^{k+1}(i)$ are generated. These candidate metrics are used by unit 402 in order to derive the initial LLRs $\lambda_{M\times(k-L_f+1)+b}$. These initial values are then combined in unit 403 with the bit decisions associated with the symbol decision $\hat{c}_{k-u}(m)$ obtained from a deduction of which trellis state has the best metric. As a result of this combination, the updated LLRs $\tilde{\lambda}_{M\times(k-L_f+1)+b}$ are generated.

Note that the proposed receiver architecture for the reduced-state approach need not require any memory storage for the initial LLRs or the best candidate metric indices $\Gamma_m(k+1)$. The proposed receiver architecture only requires storage for the state metrics (as is the case for any Viterbi processing) and for the past decision symbols $\hat{c}_{k-u}(m)$. For each state, only the latest $L_r$ decision symbols need to be stored. Hence, the overall memory requirements for the storage of the past decision symbols can be reduced to as little as $2^{L_f}\times L_r\times M$. This is significantly lower than what is required for full-state Viterbi processing architectures.

It will also be understood that, by carefully selecting the way the past decision symbols $\hat{C}_{k-u}(m)$ are stored for each trellis state, it is possible to implement the update of these symbols using only simple bit-shift and bit-mask operations.

Figure 5:
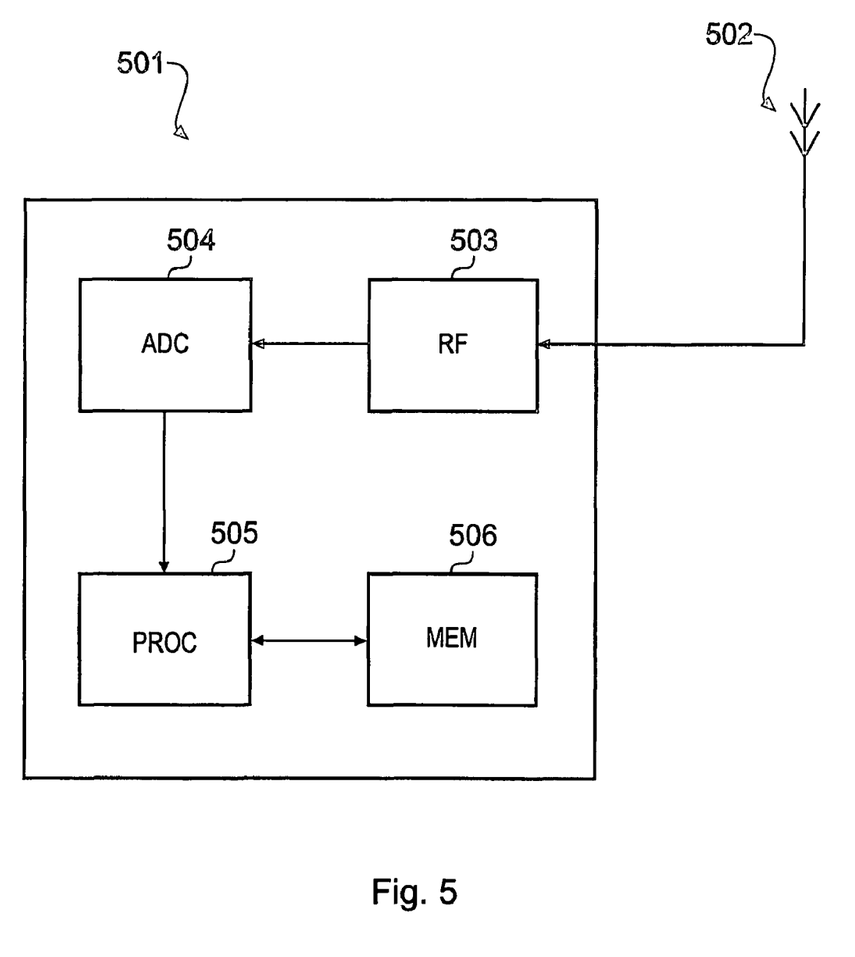
FIG. 5 illustrates a receiver architecture suitable for hosting a demodulator scheme according to the invention.

As was indicated in the introductory portion of this document, the routines described above according to the present invention for manipulating metrics and soft decisions can, for example, be implemented in base station of a wireless communications network or a mobile telephone for use in such a network. FIG. 5 illustrates a generic structure that can represent a mobile telephone, base station or similar receiver in which the invention can be implemented. The receiver 501 comprises an antenna 502 for acquiring wireless signals, an RF section 503, an analogue-to-digital conversion (ADC) section 504, a data processor 505 and a memory 506. In practice, the receiver will contain many other elements but only those necessary for an explanation of the implementation of the invention have been shown.

Signals received at the antenna 502 are down-converted in frequency and amplified at RF section 503. The signals are then converted into digital signals by ADC section 504 and passed to processor 505. The processor 505 performs the operations necessary to extract and utilise the information payload of the acquired signals, relying on the memory 506 to provide storage of signal values and other data as required. The processor 505 undertakes the routines described above according to the present invention for manipulating metrics and soft decisions, such as those outlined in FIGS. 3 and 4.

In the preceding discussion, the invention has been described in the context of a demodulation technique implementing equalisation. It will, however, be readily apparent to the skilled reader that the invention is equally applicable to the decoding of convolutionally encoded signals, in which case the central change is that the symbol memory that defines each trellis state no longer relates to propagation channel memory but instead to the memory arrangement utilised for achieving the convolutional coding of the signal.

The invention claimed is:

1. Apparatus for manipulating a received signal which corresponds to a transmitted signal comprising a series of bits, the apparatus comprising a processor arranged:
    to process the received signal using a Viterbi algorithm to produce candidate metrics for states arranged in a trellis;
    to make selections from amongst the candidate metrics to provide metrics for said states;
    to produce an initial soft decision for a bit of said series from said candidate metrics;
    to produce a hard decision for said bit from a metric selection corresponding to reception of said bit; and
    to produce an enhanced soft decision for said bit based on (1) an absolute value of the initial soft decision and (2) the hard decision,
    wherein when the hard decision for said bit is a first value, the enhanced soft decision is set to the absolute value of the initial soft decision, and when the hard decision for said bit is a second value different from the first value, the enhanced soft decision is set to a negative of the absolute value of the initial soft decision, and wherein said first and second values are either 1 or 0, respectively.

2. Apparatus according to claim 1, wherein the processor is arranged to calculate a log likelihood ratio from said candidate metrics to represent the initial soft decision.

3. Apparatus according to claim 1, wherein the processor is arranged to store in a memory a decision history of metric selections made in calculating metrics through the trellis and to trace back through the decision history to produce said hard decision.

4. Apparatus according to claim 1, wherein the processor employs a reduced-state technique in which metric selections made in moving through the trellis are treated as symbol decisions for calculating metrics further along the trellis and the processor is arranged to select one of said symbol decisions to provide said hard decision.

5. Apparatus according to claim 1, wherein the processor is arranged to select, conditional on the state of said hard decision, one of several values for said enhanced soft decision.

6. Apparatus according to claim 1, wherein the processor is arranged to select, conditional on the polarity of said initial soft decision, one of several values for said enhanced soft decision.

7. A method of manipulating a received signal which corresponds to a transmitted signal comprising a series of bits, the method comprising a step of processing the received signal using a Viterbi algorithm to produce candidate metrics for states arranged in a trellis and to make selections from amongst the candidate metrics to provide metrics for said states, a step of producing an initial soft decision for a bit of said series from said candidate metrics, a step of producing a hard decision for said bit from a metric selection corresponding to reception of said bit and a step of producing an enhanced soft decision for said bit based on (1) an absolute value of the initial soft decision and (2) the hard decision, wherein when the hard decision for said bit is a first value, the enhanced soft decision is set to the absolute value of the initial soft decision, and when the hard decision for said bit is a second value different from the first value, the enhanced soft decision is set to a negative of the absolute value of the initial soft decision, and wherein said first and second values are either 1 or 0, respectively.

8. A method according to claim 7, wherein the step of producing said initial soft decision comprises a step of calculating a log likelihood ratio from said candidate metrics to represent the initial soft decision.

9. A method according to claim 7, wherein the step of producing said hard decision comprises a step of storing a decision history of metric selections made in calculating metrics through the trellis and a step of tracing back through the decision history to produce said hard decision.

10. A method according to claim 7, wherein the step of processing the trellis to produce metrics employs a reduced-state technique in which metric selections made in moving through the trellis are treated as symbol decisions for calculating metrics further along the trellis and the step of producing said hard decision comprises a step of selecting one of said symbol decisions to provide said hard decision.

11. A method according to claim 7, wherein the step of modifying said initial soft decision comprises a step of selecting, conditional on the state of said hard decision, one of several values for said enhanced soft decision.

12. A method according to claim 7, wherein the step of modifying said initial soft decision comprises a step of selecting, conditional on the polarity of said initial soft decision, one of several values for said enhanced soft decision.

* * * * *